United States Patent
Tsuchiya et al.

(10) Patent No.: US 9,310,062 B2
(45) Date of Patent: Apr. 12, 2016

(54) LIGHT-EMITTING DEVICE AND METHOD OF MANUFACTURING THE SAME

(71) Applicant: Toyoda Gosei Co., Ltd., Kiyosu-shi (JP)

(72) Inventors: Yosuke Tsuchiya, Kiyosu (JP); Hiroyuki Tajima, Kiyosu (JP); Shota Shimonishi, Kiyosu (JP); Akira Sengoku, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 35 days.

(21) Appl. No.: 13/922,173

(22) Filed: Jun. 19, 2013

(65) Prior Publication Data

US 2014/0028173 A1    Jan. 30, 2014

(30) Foreign Application Priority Data

Jul. 24, 2012    (JP) .................................. 2012-163507
Feb. 21, 2013    (JP) .................................. 2013-031811

(51) Int. Cl.
F21V 29/00    (2015.01)
H05B 33/10    (2006.01)
H01L 33/64    (2010.01)
H05B 33/04    (2006.01)
H01L 33/50    (2010.01)

(52) U.S. Cl.
CPC ............ *F21V 29/004* (2013.01); *H01L 33/644* (2013.01); *H05B 33/04* (2013.01); *H05B 33/10* (2013.01); *H01L 33/502* (2013.01); *H01L 2224/48091* (2013.01); *H01L 2224/48247* (2013.01); *H01L 2924/1301* (2013.01)

(58) Field of Classification Search
None
See application file for complete search history.

(56) References Cited

U.S. PATENT DOCUMENTS

| 6,066,861 | A | 5/2000 | Höhn et al. | |
| 6,274,890 | B1 * | 8/2001 | Oshio et al. | 257/98 |
| 6,642,547 | B2 * | 11/2003 | Matsubara et al. | 257/98 |
| 2003/0030060 | A1 * | 2/2003 | Okazaki | 257/79 |
| 2003/0218180 | A1 * | 11/2003 | Fujiwara | 257/100 |
| 2004/0094757 | A1 | 5/2004 | Braune et al. | |
| 2007/0007542 | A1 * | 1/2007 | Fujiwara | 257/98 |
| 2008/0303411 | A1 | 12/2008 | Ohta et al. | |
| 2011/0001148 | A1 * | 1/2011 | Sun et al. | 257/88 |
| 2012/0112623 | A1 | 5/2012 | Kobashi | |
| 2013/0207152 | A1 * | 8/2013 | Koseki et al. | 257/99 |

FOREIGN PATENT DOCUMENTS

| JP | 11-500584 A | 1/1999 |
| JP | 11-040858 A | 2/1999 |
| JP | 2005-524737 A | 8/2005 |
| JP | 2007-227791 A | 9/2007 |
| JP | 2009-016779 A | 1/2009 |
| JP | 2012-114416 A | 6/2012 |

* cited by examiner

*Primary Examiner* — Britt D Hanley
(74) *Attorney, Agent, or Firm* — McGinn IP Law Group, PLLC

(57) ABSTRACT

A light-emitting device includes a base material having a conductor layer on a surface thereof, the conductor layer being configured to be connected to an external power source, a light-emitting element mounted on the base, a phosphor layer arranged above the light-emitting element, and a resin layer contacting both of the phosphor layer and the conductor layer and containing heat-conductive particles dispersed therein. The heat-conductive particles have a thermal conductivity of not less than 100 W/m·K and an insulator property or a semiconductor property.

19 Claims, 5 Drawing Sheets

LIGHT-EMITTING DEVICE AND METHOD OF MANUFACTURING THE SAME

The present application is based on Japanese patent applications Nos. 2012-163507 and 2013-031811 filed on Jul. 24, 2012 and Feb. 21, 2013, respectively, the entire contents of which are incorporated herein by reference.

BACKGROUND OF THE INVENTION

1. Field of the Invention

The invention relates to a light-emitting device in which a phosphor and a light-emitting element are used and a method of manufacturing the same, and in more particular, to a light-emitting device in which a phosphor and a light-emitting element are used to produce white light and a method of manufacturing the same.

2. Related Art

In so-called COB (Chip-on-Board) modules, plural light-emitting elements such as LED chips are mounted on a general-purpose substrate such as ceramic substrate or metal substrate. In LED lamps, a light-emitting element is mounted on a resin or ceramic package. In light-emitting devices such as COB modules or LED lamps, an LED chip emitting ultraviolet to blue light is used and a phosphor is contained in a sealing portion sealing the LED chip. Phosphor particles are excited by light emitted at the time of driving the light-emitting element and emit a desired wavelength-converted light in blue to red color, and white light is obtained as a mixed light of the light of the light-emitting element and the wavelength-converted light or as a mixed light of the wavelength-converted lights only. As such, in recent years, use of phosphor has become the mainstream when white light is obtained using a light-emitting element.

The following three typical methods are known as a measure to incorporate phosphor particles into a sealing portion. Here, examples of applying these methods to an LED lamp will be described.

In the first method, an LED chip 2 is mounted on a package 1 and phosphor particles 3a are arranged in a sealing portion 3 on a LED chip-mounting side, as shown in FIG. 1A (hereinafter, referred to as a "precipitation arrangement"). The precipitation arrangement has an advantage in that it is possible to convert a wavelength of the phosphor particle 3a at high efficiency since the phosphor particles 3a are arranged in the vicinity of the LED chip 2 (see, e.g., JP-A-11-040858, JP-A-2007-227791, JP-A-2009-016779 and JP-A-2012-114416).

In the second method, the phosphor particles 3a are arranged so as to be uniformly dispersed in the sealing portion 3, as shown in FIG. 1B (hereinafter, referred to as a "dispersed arrangement"). This method has an advantage in that it is easy to control color of the light-emitting device (see, e.g., JP-T-2005-524737).

In the third method, the phosphor particles 3a are arranged in the sealing portion 3 at a position away from the LED chip 2 which is mounted on the package 1, as shown in FIG. 1C (hereinafter, referred to as a "separate arrangement"). The separate arrangement has an advantage in that color unevenness due to change in visual angle when viewing the LED lamp from an observer side can be prevented (see, e.g., JP-T-H11-500584).

When the LED lamp is emitting light, heat is built-up in the LED lamp due to heat generated by driving the LED chip 2 and heat generated by wavelength conversion of the phosphor particles 3a. This causes problems in that the sealing portion 3 or other components, such as LED chip 2, constituting the LED lamp deteriorate, resulting in a decrease in brightness and reliability of the LED lamp. Therefore, as a measure against heat generation in the LED lamp, heat is generally dissipated from a mounting surface of the LED lamp through a lead 1a which is a portion for mounting the LED chip 2. This method is also used for the COB module in the same manner and heat is generally dissipated from a wiring on a ceramic substrate or a mounting surface of a metal substrate which constitute the LED lamp.

SUMMARY OF THE INVENTION

Especially in case of the separate arrangement, heat generated by the LED chip 2 is likely to be dissipated through the lead 1a but heat generated by the phosphor particles 3a is less likely to be dissipated through the lead 1a since the lead 1a is away from the phosphor particles 3a. Therefore, the separate arrangement has a problem that the heat generated by the phosphor particles 3a is not sufficiently dissipated and deterioration of the sealing portion 3 is thus likely to occur.

It is an object of the invention to improve heat dissipation from phosphor particles.

(1) According to one embodiment of the invention, a light-emitting device comprises:
 a base material having a conductor layer on a surface thereof, the conductor layer being configured to be connected to an external power source;
 a light-emitting element mounted on the base;
 a phosphor layer arranged above the light-emitting element; and
 a resin layer contacting both of the phosphor layer and the conductor layer and containing heat-conductive particles dispersed therein,
wherein the heat-conductive particles have a thermal conductivity of not less than 100 W/m·K and an insulator property or a semiconductor property.

Here, "above the light-emitting element" means contacting with the upper surface of the light-emitting element or being away from the upper surface of the light-emitting element.

Also, "phosphor layer" means a layer (or matrix) with phosphor particles densely dispersed therein in the form of a layer.

In the above embodiment (1) of the invention, the following modifications and changes can be made.

(i) The resin layer comprises the base material.

(ii) The light-emitting device further comprises a white resin portion between the light-emitting element and the base material.

(iii) The phosphor layer is in contact with the light-emitting element.

(iv) The light-emitting device further comprises a sealing portion between the light-emitting element and the white resin portion,
 wherein the sealing portion is in contact with and seals the light-emitting element.

(v) The resin layer comprises a resin sealing portion contacting and sealing the light-emitting element,
 wherein an upper portion of the sealing portion away from the light-emitting element has a phosphor particle concentration higher than a lower portion of the sealing portion in contact with the light-emitting element, and
 wherein the heat-conductive particles are dispersed at least in the lower portion of the sealing portion.

(vi) The heat-conductive particles comprise at least one of CNT, diamond, c-BN, SiC, BeO and AlN.

(2) According to another embodiment of the invention, a method of manufacturing the light-emitting device according to the above embodiment (1) comprises:
  forming the lower portion of the sealing portion by supplying a first sealing material containing the heat-conductive particles so as to be in contact with the light-emitting element; and
  forming the upper portion of the sealing portion by supplying a second sealing material containing the phosphor particles on a surface of the first sealing material.
(3) According to another embodiment of the invention, a method of manufacturing the light-emitting device according to the above embodiment (1) comprises:
  supplying a thermosetting sealing material so as to be in contact with the light-emitting element, the thermosetting sealing material containing the heat-conductive particles and the phosphor particles having greater specific gravity than that of the heat-conductive particles;
  while maintaining the light-emitting device so that gravity acts toward a surface of the thermosetting sealing material, decreasing viscosity of the thermosetting sealing material by heating at a first temperature to precipitate the phosphor particles in the thermosetting sealing material on the surface side; and
  curing the thermosetting sealing material by heating at a second temperature higher than the first temperature.

Effects of the Invention

According to one embodiment of the invention, a light-emitting device is constructed such that a phosphor layer is arranged above a light-emitting element, and a resin layer contacts both of a phosphor layer and a conductor layer and contains heat-conductive particles dispersed therein, wherein the heat-conductive particles have a thermal conductivity of not less than 100 W/m·K and an insulator property or a semiconductor property.

Thus, since the heat-conductive particles are disposed dispersed between the phosphor layer as a heat-generating body and the conductor layer as a heat-dissipating route, the thermal resistance between the phosphor particles and the conductor layer can be reduced so as to enhance the heat dissipation from the phosphor particles. Thereby, it is possible to suppress heat deterioration in members composing the light-emitting device.

Light-diffusing particles for diffusing light, such as $SiO_2$, $TiO_2$ and $Al_2O_3$ are generally contained as a filler in a sealing portion but the thermal conductivities of $SiO_2$, $TiO_2$ and $Al_2O_3$ are only about 1.5 W/m·K, 10 W/m·K and 30 W/m·K, respectively, and therefore, an effect of improving a thermal conductivity is insufficient.

The invention focuses on improvement in thermal conductivity, not on improvement in light-diffusing properties. Therefore, the configuration and effect of the filler are different from the conventional filler contained in a sealing portion. And also, a positional relation between phosphor particles and the filler and an effect resulting therefrom are also different.

In addition, "a conductor layer connected to an external power source" in the embodiment of the invention includes an external electrical connection lead of the LED lamp and a wiring or metal substrate of the COB module and it is acceptable as long as it is a conductor electrically or thermally connected to the external power source.

BRIEF DESCRIPTION OF THE DRAWINGS

Next, the present invention will be explained in more detail in conjunction with appended drawings, wherein:

FIGS. 1A to 1C are cross sectional views showing conventional light-emitting devices, wherein FIG. 1A is a cross sectional view showing a precipitation arrangement of phosphor particles, FIG. 1B is a cross sectional view showing a dispersed arrangement of phosphor particles and FIG. 1C is a cross sectional view showing a separate arrangement of phosphor particles;

DESCRIPTION OF THE PREFERRED EMBODIMENTS

The first embodiment of the invention will be described below in reference to the appended drawings.

Figure 1A:
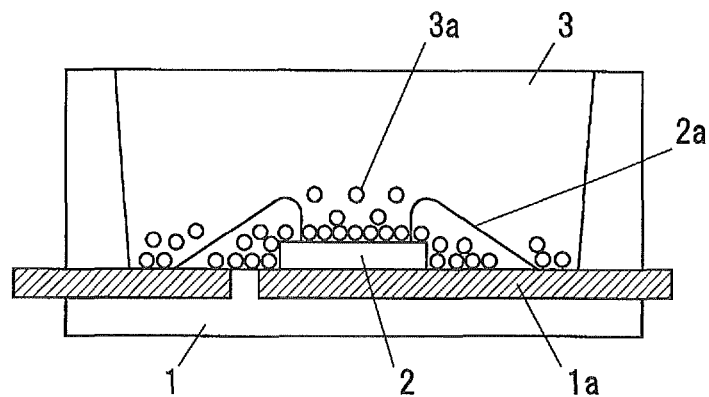
Figure 1B:
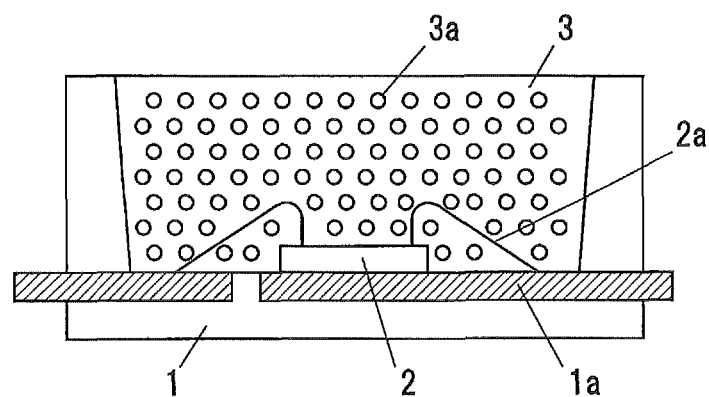
Figure 1C:
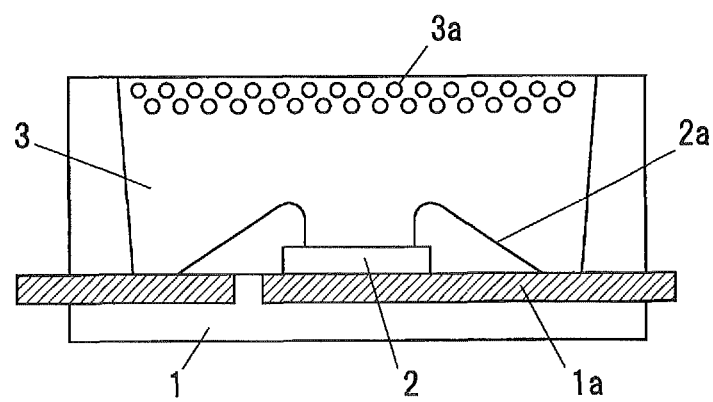
Figure 2:
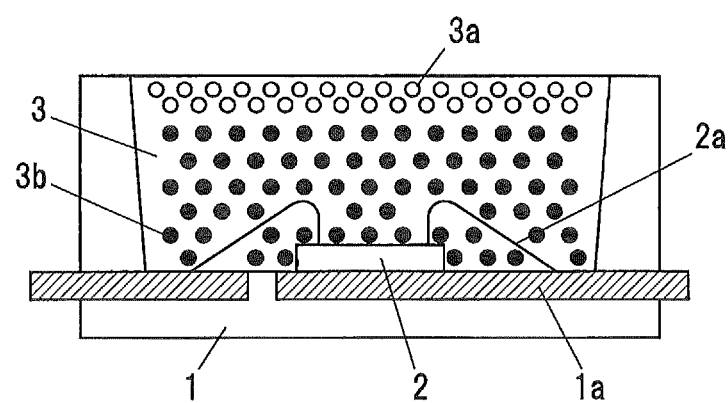
FIG. 2 is a cross sectional view showing a light-emitting device in a first embodiment of the present invention.

FIG. 2 is a cross sectional view showing an LED lamp in the first embodiment of the invention.

The LED lamp in the first embodiment of the invention is composed of a package 1 having a pair of leads 1a on a bottom surface of a recessed portion, an LED chip 2 which is formed of an inorganic compound semiconductor emitting ultraviolet to blue light and is mounted on one of the pair of leads 1a, and a sealing portion 3 filling the recessed portion of the package 1 while being in contact with and sealing the LED chip 2.

The LED chip 2 is mounted in so-called face-up manner, and positive and negative electrodes thereof (not shown) are respectively electrically connected to the pair of leads 1a via wires 2a formed of Au, etc. The pair of leads 1a protrude outward from side surfaces of the package 1 and the protruding portions thereof function as external connection terminals. The pair of leads 1a are electrically and thermally connected to the outside via the protruding portions thereof.

The package 1 is formed of a thermoplastic resin such as polyamide resin or liquid crystal polymer resin, etc., a thermosetting resin such as epoxy resin or silicone resin, etc., or a ceramic such as alumina. When the package 1 is formed of a resin material, white pigment particles of $TiO_2$, etc., are contained in the package 1 in order to reflect light and light emitted from the LED chip 2 is reflected and guided toward an opening of the recessed portion of the package 1.

The sealing portion 3 is formed of a thermosetting resin epoxy resin or silicone resin, etc., or an inorganic material such as sol-gel glass. The sealing portion 3 contains phosphor particles 3a with higher concentration in an upper portion than in a lower portion, and heat-conductive particles 3b are uniformly dispersed in the lower portion.

Followings are examples of the phosphor particle 3a used in the first embodiment.
(Blue Phosphor)
  $BaMgAl_{10}O_{17}:Eu^{2+}$
(Green to Orange Phosphor)
  $Y_3Al_5O_{12}:Ce^{3+}$
  $(Ba, Sr)_2SiO_4:Eu^{2+}$
  $Ca(Si, Al)_{12}(O,N)_{16}: Eu^{2+}$
  $SrSi_2O_2N_2:Eu^{2+}$
(Red Phosphor)
  $CaAlSiN_3: Eu^{2+}$
  $K_2SiF_6: Mn^{4+}$ The heat-conductive particle 3b used in the embodiments of the invention is a material having such characteristics that thermal conductivity is not less than 100 W/m·K. Followings are examples of the heat-conductive particle 3b having such characteristics.

CNT (Carbon-Nano-Tube (thermal conductivity: 3000 W/m·K))
Diamond (thermal conductivity: 2100 W/m·K)
c-BN (cubic boron nitride (thermal conductivity: 1300 W/m·K))
SiC (silicon carbide (thermal conductivity: 270 W/m·K))
BeO (beryllium oxide (thermal conductivity: 260 W/m·K))
AlN (aluminum nitride (thermal conductivity: 230 W/m·K))

Such materials are insulators or semiconductors arranged in the lower portion of the sealing portion in a dispersed state and thus are less likely to cause short-circuit even if arranged in contact with the LED chip 2 or the wire 2a.

In the LED lamp of the first embodiment of the invention having such a configuration, the heat-conductive particles 3b having thermal conductivity of not less than 100 W/m·K and having insulating properties or semiconducting properties are dispersed in the lower portion of the sealing portion 3 even in the case of the separate arrangement in which the LED chip 2 is sealed with the sealing portion 3 having a higher concentration of the phosphor particles 3a in the upper portion away from the LED chip 2 than in the lower portion in contact with the LED chip 2.

Therefore, the thermal resistance between the phosphor particles 3a as a heating element and the lead 1a as a heat dissipation path decreases by dispersing and arranging the heat-conductive particles 3b between the lead 1a and the upper portion of the sealing portion 3 having a high concentration of the phosphor particles 3a, and it is thus possible to enhance dissipation of heat from the phosphor particles 3a via the lower portion of the sealing portion 3.

As a result, it is possible to suppress deterioration of the sealing portion 3.

Alternatively, the heat-conductive particles 3b may be contained in the package 1. In this case, since heat from the phosphor particles 3a can be dissipated not only through the lower portion of the sealing portion 3 but also through the package 1, the thermal resistance in a direction toward the lower portion of the LED lamp further decreases.

Next, two methods will be described as examples of the method of manufacturing the LED lamp shown in FIG. 2.

In the first method, the upper and lower portions of the sealing portion 3 are separately supplied into the recessed portion of the package 1.

That is, after supplying a first sealing material containing the heat-conductive particles 3b so as to be in contact with the LED chip 2, a second sealing material containing the phosphor particles 3a is supplied on a surface of the first sealing material. After that, the first and second sealing materials are simultaneously cured by, e.g., heating, thereby obtaining the LED lamp having the sealing portion 3 shown in FIG. 2.

In the second method, the upper and lower portions of the sealing portion 3 are simultaneously supplied into the recessed portion of the package 1.

That is, a thermosetting sealing material, such as epoxy resin or silicone resin, containing both the heat-conductive particles 3b having relatively small specific gravity and the phosphor particles 3a having relatively large specific gravity is supplied so that the thermosetting sealing material is in contact with the LED chip 2 mounted on the bottom surface of the recessed potion of the package 1 and fills the recessed portion of the package 1. Then, while maintaining the package 1 in a direction (the same direction as a gravity-acting direction) opposite to a direction of supplying a resin (an opposite direction to the gravity-acting direction) so that gravity acts toward a surface of the thermosetting sealing material, the phosphor particles are precipitated in the sealing material on the surface side at a relatively low temperature which decreases viscosity of the thermosetting sealing once.

At this time, the phosphor particles 3a are generally precipitated on the surface of the sealing material due to large specific gravity but the heat-conductive particles 3b are generally hardly precipitated since the specific gravity thereof is small. The thermosetting resin is cured in this state by heating to a curing temperature thereof and it is thereby possible to obtain the LED lamp having the sealing portion 3 shown in FIG. 2.

Figure 3:
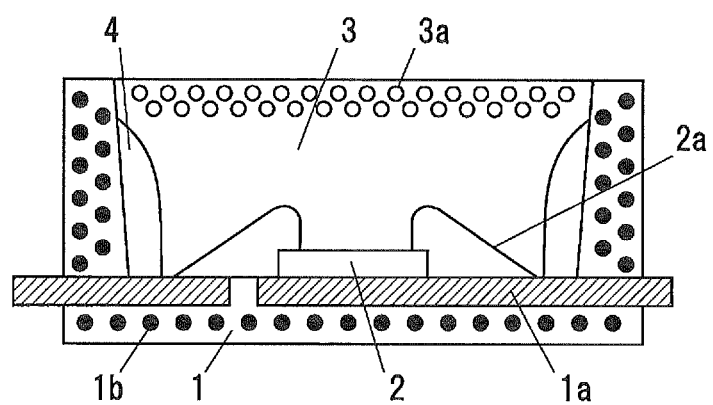
FIG. 3 is a cross sectional view showing a light-emitting device in a second embodiment of the invention.

FIG. 3 is a cross sectional view showing an LED lamp in a second embodiment of the invention.

The second embodiment is different from the first embodiment in that heat-conductive particles 1b are not contained in the sealing portion 3 unlike the first embodiment but are dispersed and contained in the package 1 and also a white resin portion 4 is formed so as not to overlap with a portion of the sealing portion 3 having a high concentration of the phosphor particles 3a.

The white resin portion 4 contains white pigment particles of $TiO_2$, etc., and is formed so that a reflectivity with respect to light emitted from the LED chip 2 is higher than the package 1 which contains the heat-conductive particles 1b.

For forming the white resin portion 4 in the second embodiment, for example, the package 1 is formed by molding such as injection molding or transfer molding, and then, a thermosetting resin, such as uncured epoxy resin or silicone resin, containing white pigment particles of $TiO_2$, etc., is applied by dispensing, etc., along an inner wall of a reflector portion corresponding to the recessed portion of the package 1 and is cured by heating.

In the LED lamp of the second embodiment of the invention having such a configuration, since the thermal resistance between the phosphor particles 3a as a heating element and the lead 1a as a heat dissipation path decreases by dispersing and arranging the heat-conductive particles 1b in the reflector portion of the package 1 which is in contact with both the lead 1a and the upper portion of the sealing portion 3 having a high concentration of the phosphor particles 3a, it is possible to enhance dissipation of heat from the phosphor particles 3a via the lower portion of the sealing portion 3.

As a result, it is possible to suppress deterioration of the sealing portion 3.

In addition, since the white resin portion 4 is formed along the inner wall of the reflector portion of the package 1, the light emitted from the LED chip is reflected by the white resin portion 4 which has a higher reflectivity than the package 1.

As a result, it is possible to improve light extraction efficiency of the LED lamp.

Figure 4:
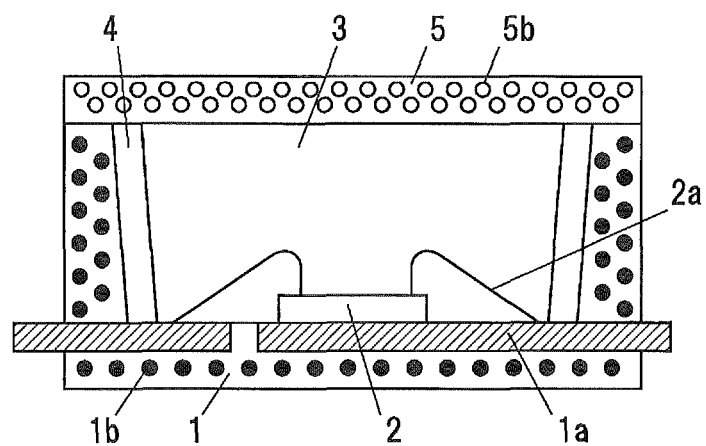
FIG. 4 is a cross sectional view showing a light-emitting device in a modification of the second embodiment of the invention.

FIG. 4 is a cross sectional view showing an LED lamp in a modification of the second embodiment.

The present modification is different from the LED lamp shown in FIG. 3 in that the white resin portion 4 reaching to the top surface is formed on the inner wall of the reflector portion of the package 1 and phosphor particles 5b are dispersed and contained in a plate material 5 which is formed separately from the sealing portion 3.

The white resin portion 4 in the present modification can be formed by dispenser coating as described above. And it is also possible to form the white resin portion 4 as follows; for example, the package 1 is formed using a mold corresponding to an outer shape of the package 1 by molding such as injection molding or transfer molding, and then, molding such as injection molding or transfer molding of a resin containing white pigment particles of $TiO_2$, etc., e.g., a thermoplastic resin such as uncured polyamide resin or liquid crystal polymer resin, etc., or a thermosetting resin such as epoxy resin or silicone resin, etc., is performed again using a mold corresponding to the shapes of the package 1 and the white resin portion 4.

Meanwhile, it is possible to form the plate material 5 containing the phosphor particles 5b as follows; for example, a thermosetting resin, such as uncured epoxy resin or silicone resin, containing the phosphor particles 5b is cured so as to have a plate shape and is then attached to the top surfaces of the white resin portion 4 and the sealing portion 3.

Alternatively, a thermosetting resin, such as uncured epoxy resin or silicone resin, containing the phosphor particles 5b is screen-printed on the top surfaces of the white resin portion 4 and the sealing portion 3 and is then cured.

In the LED lamp of the present modification having such a configuration, in addition to the above-mentioned effects, it is possible to easily provide the phosphor particles 5b at a high concentration and the manufacturing process is thereby simplified.

Alternatively, the plate material itself may be a phosphor. In such a case, since the plate material 5 can be formed by sintering a material of the phosphor and then slicing the sintered object without crushing into particles, manufacturing process is further simplified.

Figure 5:
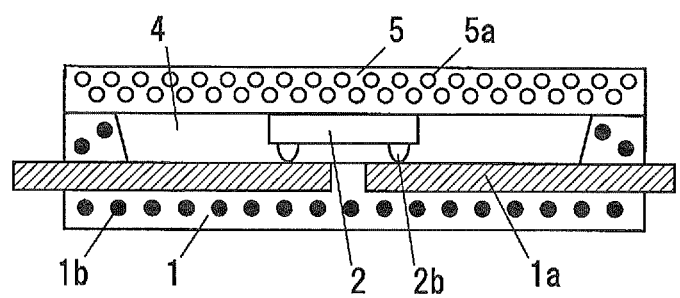
FIG. 5 is a cross sectional view showing a light-emitting device in a third embodiment of the invention.

FIG. 5 is a cross sectional view showing an LED lamp in a third embodiment of the invention.

The third embodiment is different from the first and second embodiments in that so-called flip-chip mounting in which the LED chip 2 is joined to the package at an electrode forming surface and is electrically connected to the lead 1a via bumps 2b formed of Au, etc., is employed instead of employing the so-called face-up mounting in which LED chip 2 is joined to the package at a surface opposite to the electrode forming surface and is electrically connected to the lead via the wires, and also in that the sealing portion 3 is not formed.

In other words, the LED chip 2 is sealed so that the white resin portion 4 and the plate material 5 are in contact with the LED chip 2.

For forming the white resin portion 4 in the third embodiment, for example, the package 1 is formed by molding such as injection molding or transfer molding, the LED chip 2 is subsequently flip-chip mounted via the bumps 2b, and then, a thermosetting resin, such as uncured epoxy resin or silicone resin, containing white pigment particles of $TiO_2$, etc., is applied and filled in a space between the LED chip 2 and the package 1 by dispensing, etc.

It is possible to form by applying the thermosetting resin along the inner wall of the reflector portion corresponding to the recessed portion of the package 1 and then curing with heat.

Meanwhile, after formation of the white resin portion 4 and subsequent polishing to flatten the top surfaces of the package 1, the white resin portion 4 and the LED chip 2, the plate material 5 can be formed by the same method as the modification of the second embodiment. Since the polishing is performed, the bondability between the plate material 5 and the package 1, the white resin portion 4 and the LED chip 2 is improved by an anchor effect.

In the LED lamp of the third embodiment having such a configuration, the plate material 5 containing the phosphor particles 5b is in contact with not only the package 1 containing the heat-conductive particles 1b but also the LED chip 2. This enhances heat dissipation to the leads 1a through both of the package 1 and the LED chip 2 and thus improves heat dissipation properties.

Although examples of the application of the invention to an LED lamp have been described in the embodiments, the invention is not limited thereto and is applicable to so-called COB modules or any other general light-emitting devices using a phosphor and an LED chip. In addition, although examples of the application of the invention in which an LED chip is used have been described in the embodiments of the invention, it is possible to use other light-emitting elements such as light-emitting thyristor chip or laser diode chip.

Although the invention has been described with respect to the specific embodiments for complete and clear disclosure, the appended claims are not to be therefore limited but are to be construed as embodying all modifications and alternative constructions that may occur to one skilled in the art which fairly fall within the basic teaching herein set forth.

What is claimed is:

1. A light-emitting device, comprising:
a base material comprising a conductor layer on a surface thereof, the conductor layer being configured to be connected to an external power source;
a light-emitting element mounted on the base material;
a phosphor layer arranged above the light-emitting element; and
a resin layer contacting both of the phosphor layer and the conductor layer and comprising heat-conductive particles dispersed therein so as to decrease a thermal resistance between the phosphor layer and the conductor layer,
wherein the heat-conductive particles have a thermal conductivity of not less than 100 W/mK and an electrical insulator property or a semiconductor property,
wherein the resin layer comprises the base material,
wherein the base material further comprises a recessed portion and white pigment particles, and
wherein the light-emitting element is mounted on a bottom surface of the recessed portion.

2. The light-emitting device according to claim 1, further comprising a white resin portion between the light-emitting element and the base material.

3. The light-emitting device according to claim 2, wherein the phosphor layer is in contact with the light-emitting element.

4. The light-emitting device according to claim 3, further comprising a sealing portion between the light-emitting element and the white resin portion,
wherein the sealing portion is in contact with and seals the light-emitting element.

5. The light-emitting device according to claim 1, wherein the resin layer comprises a resin sealing portion contacting and sealing the light-emitting element,
wherein an upper portion of the sealing portion away from the light-emitting element has a phosphor particle concentration higher than a lower portion of the sealing portion in contact with the light-emitting element, and
wherein the heat-conductive particles are dispersed at least in the lower portion of the sealing portion.

6. The light-emitting device according to claim 1, wherein the heat-conductive particles comprise at least one of a carbon nanotube (CNT), diamond, cubic boron nitride (c-BN), SiC, BeO and MN.

7. A method of manufacturing the light-emitting device according to claim 5, comprising:

forming the lower portion of the sealing portion by supplying a first sealing material containing the heat-conductive particles so as to be in contact with the light-emitting element; and forming the upper portion of the sealing portion by supplying a second sealing material containing the phosphor particles on a surface of the first sealing material.

8. A method of manufacturing the light-emitting device according to claim 5, comprising:

supplying a thermosetting sealing material so as to be in contact with the light-emitting element, the thermosetting sealing material containing the heat-conductive particles and the phosphor particles having greater specific gravity than that of the heat-conductive particles;

while maintaining the light-emitting device so that gravity acts toward a surface of the thermosetting sealing material, decreasing viscosity of the thermosetting sealing material by heating at a first temperature to precipitate the phosphor particles in the thermosetting sealing material on the surface side; and curing the thermosetting sealing material by heating at a second temperature higher than the first temperature.

9. The light-emitting device according to claim 1, wherein the resin layer is formed on the light-emitting element such that the heat-conductive particles are dispersed in the resin layer between the light-emitting element and the phosphor layer.

10. The light-emitting device according to claim 1, wherein the heat-conductive particles conduct heat generated by the phosphor layer to the conductor layer for dissipating the heat.

11. The light-emitting device according to claim 1, wherein the base material comprises a package of the light-emitting device.

12. The light-emitting device according to claim 11, wherein the conductor layer comprises a pair of leads which are connected by wires to positive and negative electrodes on the light-emitting element, and the pair of leads protrude outward from a side surface of the package.

13. The light-emitting device according to claim 11, wherein the package comprises one of a thermoplastic resin, a thermosetting resin and a ceramic.

14. The light-emitting device according to claim 1, wherein the resin layer comprises a sealing portion comprising one of a thermosetting resin, an epoxy resin, a silicone resin and an inorganic material.

15. The light-emitting device according to claim 1, wherein the heat-conductive particles are uniformly dispersed in a lower portion of the resin layer, which is between the light-emitting element and the phosphor layer.

16. The light-emitting device according to claim 1, wherein the phosphor layer comprises plural phosphor particles including at least one member selected from a group consisting of $BaMgAl_{10}O_{17}:Eu^{2+}$, $Y_3Al_5O_{12}:Ce^{3+}$, $(Ba, Sr)_2SiO_4:Eu^{2+}$, $Ca(Si, Al)_{12}(O,N)_{16}:Eu^{2+}$, $SrSi_2O_2N_2:Eu^{2+}$, $CaAlSiN_3:Eu^{2+}$, and $K_2SiF_6:Mn^{4+}$.

17. A light-emitting device, comprising:

a package;

a lead formed on the package;

a light-emitting element formed on the package and electrically connected to the lead;

a sealing member formed in the package on the light-emitting element, the sealing member comprising:

a lower portion contacting the light-emitting element and comprising a plurality of the heat-conductive particles including a thermal conductivity of not less than 100 W/mK and an electrical insulator property or a semiconductor property;

and an upper portion formed on and contacting the lower portion and comprising a plurality of phosphor particles, the heat-conductive particles conducting heat generated by the plurality of phosphor particles to the lead for dissipating the heat, wherein the package and the sealing member comprise a base material, wherein the base material further comprises a recessed portion and white pigment particles, and wherein the light-emitting element is mounted on a bottom surface of the recessed portion.

18. The light-emitting device according to claim 1, wherein the resin layer comprises a portion formed on a side of the light-emitting element and extending from an upper surface of the light-emitting element to an upper surface of the conductor layer, and the heat-conductive particles are dispersed in the portion of the resin layer.

19. The light-emitting device according to claim 1, wherein the conductor layer comprises a pair of leads which protrude outward from a side surface of the package and dissipate heat generated by the plurality of phosphor particles through the package.

* * * * *